United States Patent [19]
Ovens et al.

[11] Patent Number: 5,128,558
[45] Date of Patent: Jul. 7, 1992

[54] HIGH SPEED, LOW POWER CONSUMPTION VOLTAGE SWITCHING CIRCUIT FOR LOGIC ARRAYS

[75] Inventors: Kevin M. Ovens, Garland; Jeffrey A. Niehaus, Dallas, both of Tex.

[73] Assignee: Texas Instruments Incorporated, Dallas, Tex.

[21] Appl. No.: 704,909

[22] Filed: May 21, 1991

Related U.S. Application Data

[63] Continuation of Ser. No. 423,275, Oct. 18, 1989, abandoned.

[51] Int. Cl.⁵ .................... G06F 7/38; H03K 19/086
[52] U.S. Cl. .................... 307/465; 307/455;
　　307/456; 307/466; 307/467; 307/546;
　　307/296.3; 365/189.08; 365/227
[58] Field of Search .............. 307/443, 454–456,
　　307/465–467, 530, 546, 296.3; 365/189.08, 227

[56] References Cited

U.S. PATENT DOCUMENTS

| | | | |
|---|---|---|---|
| 4,422,162 | 12/1983 | Davis et al. | 365/227 |
| 4,645,953 | 2/1987 | Wong | 307/465 |
| 4,801,820 | 1/1989 | Nootbaar | 307/465 |
| 4,839,539 | 6/1989 | Takata et al. | 307/469 |
| 4,906,862 | 3/1990 | Itano et al. | 365/227 |
| 4,999,519 | 3/1991 | Kitsukawa et al. | 365/227 |

Primary Examiner—Stanley D. Miller
Assistant Examiner—Margaret Rose Wambach
Attorney, Agent, or Firm—B. Peter Barndt; Richard L. Donaldson; T. J. Cole

[57] ABSTRACT

A memory device (10) includes switching circuitry 22 comprising sensing and control circuits (24 and 26) to predict the next state of the output of memory device (12) and to turn on and off current sources (20) responsive to said memory output to provide faster output transitions.

16 Claims, 2 Drawing Sheets

HIGH SPEED, LOW POWER CONSUMPTION VOLTAGE SWITCHING CIRCUIT FOR LOGIC ARRAYS

This application is a continuation of application Ser. No. 07/423,275, filed Oct. 18, 1989, now abandoned.

TECHNICAL FIELD OF THE INVENTION

This invention relates in general to integrated circuits, and more particularly to a voltage switching circuit for logic arrays.

BACKGROUND OF THE INVENTION

In integrated circuit design, great emphasis is placed on the operating speed of a circuit. In fixed-memory devices, such as programmable array logic (PAL), a current source is often coupled to each product line of the PAL in order to decrease the product line high-to-low transition time.

In operation, the current sources remain on continuously. When the inputs to all of the emitter follower transistors connected to a product line are low, it is desired that the logic level on the product line be low. The current source associated with the product line "pulls down" the emitter followers, turning them off more rapidly than they would without the current source. The result is that the product line also pulls down more rapidly.

When one of the inputs is high, it is desired that the logic level on the product line also be high. In order for the emitter follower connected to the high input to turn on, it must overcome the pull down from the current source. This requires more than would be needed without the current source.

Thus, while this circuitry is faster than a PAL without current sources, it has the disadvantage of drastically increasing the power consumed by the device. A further disadvantage is that increasing the current to increase the high-to-low transition speed also decreases the low-to-high transition speed.

Therefore, a need has arisen to provide a circuit for providing a fast high-to-low product line transition speed without increasing the low-to-high transition speed and further, without increasing power consumption of the device.

SUMMARY OF THE INVENTION

In accordance with present invention, a switching circuit is provided which substantially increases the transition speed of signals on the product lines of a logic array.

A switching circuit is provided which detects the current state of the product line. If the circuit detects that the current state of the memory output is at a high logic level, a plurality of current sources generate an increased current through the product lines. If the sensing circuit detects that the current output state is a low level, the current generated by the current sources is reduced; simultaneously, a voltage is applied to the memory output enabling the output to make a more rapid transition to a high state.

The circuit of the present invention may be used with any fixed memory device such as a PAL or a ROM. Hence, the circuit of the present invention has the technical advantage of providing more rapid transitions of the memory's product lines in both directions while eliminating unnecessary and wasteful power consumption when the current sources are not needed.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiment of the present invention is best understood by referring to FIGS. 1-4 of the drawings, like numerals being used for like and corresponding parts of the various drawings.

Figure 1:
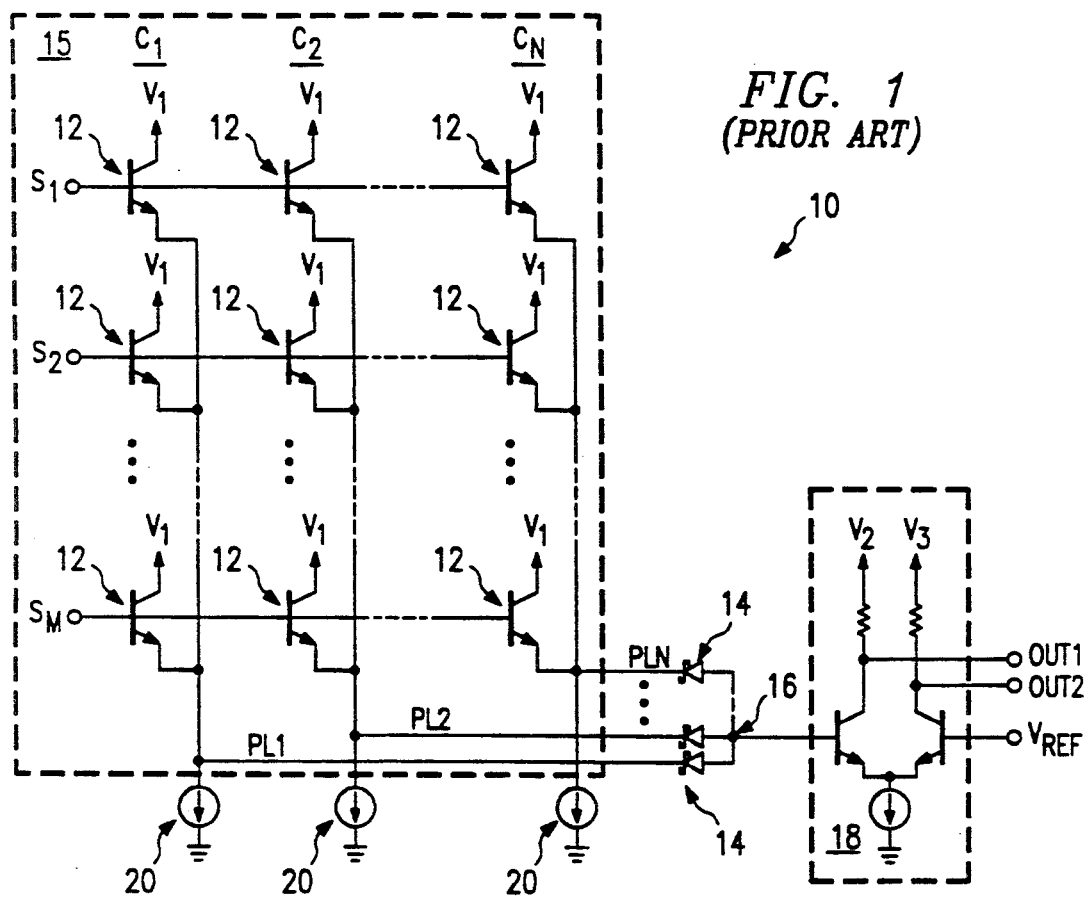
FIG. 1 illustrates a schematic representation of a prior art fixed memory device.

FIG. 1 illustrates a schematic representation of a prior art programmable array logic (PAL) memory device, generally referred to by reference numeral 10. Emitter followers 12 and diodes 14 form a logic matrix 15 whose output at node 16 is a function of input signals S1-SM. The emitter of each transistor 12 in each column C1-CN is coupled to a product line PL1-PLN. The anode of each diode 14 is coupled to node 16 and the cathode is coupled to a product line PL1-PLN. The matrix output at node 16 forms the input to differential pair circuitry 18 having complement and true outputs OUT1 and OUT2, respectively. A current source 20 is coupled between each product line PL1-PLN and ground.

In operation, a current source 20 will pull down the product line to which it is coupled, when each input S1-SM, and therefore each transistor 12, coupled to the product line is low. When one or more of transistors 12 in a particular column turns on, the associated product line is pulled to a high logic state. A larger current from current source 20 pulls the product line down faster than would be possible with smaller current, increasing the high-to-low transition speed. However, this current, which in the prior art is continuous, makes it more difficult for a transistor 12 to pull up the product line to a high logic level.

Figure 2:
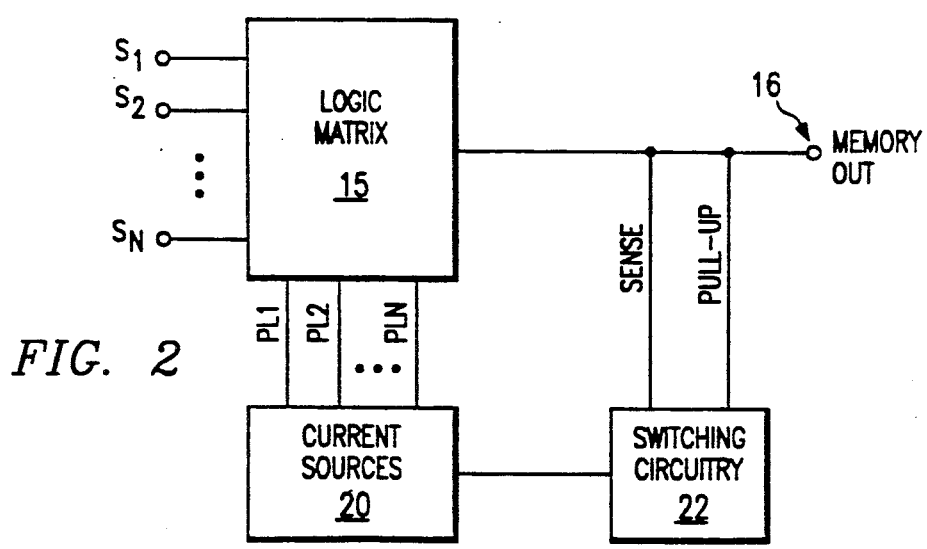
FIG. 2 illustrates a block diagram of a fixed memory device using the speedup circuitry of the present invention.

FIG. 2 illustrates a block diagram of the current invention 22 coupled to a prior art logic array. Signals S1-SM form the inputs to the logic matrix 15, comprising transistors 12, and node 16 forms the output. Current sources 20 are coupled to product lines PL1-PLN and are turned high and low by the switching circuitry 22 of the present invention. Switching circuitry 22 is connected to the output node 16 using a sensing input to detect the logic state of the output 16 and a pull-up output which is operable to pull up the matrix output during a low-to-high transition as described in greater detail in connection with FIG. 4.

Figure 3:
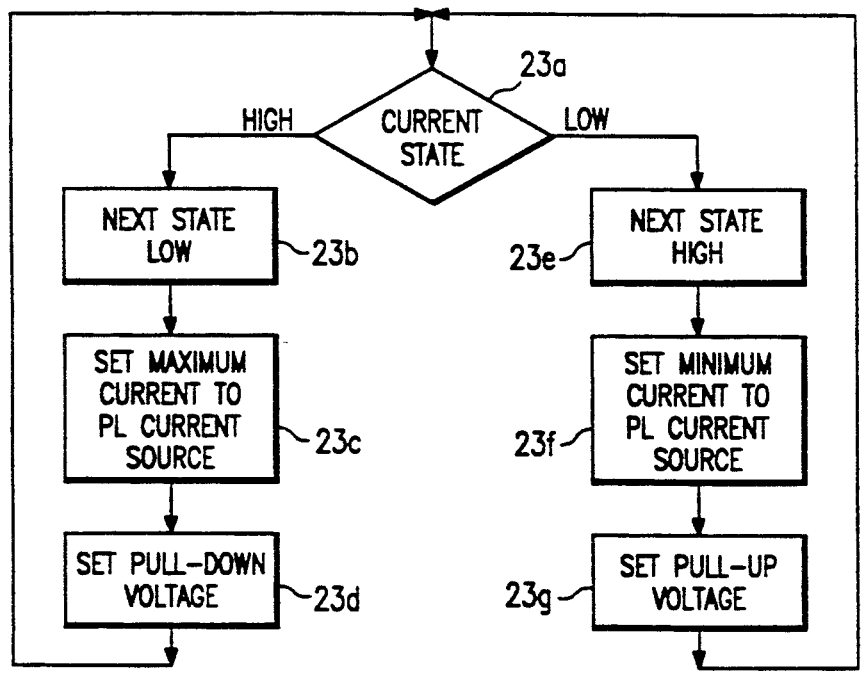
FIG. 3 illustrates a flow chart describing the logic of the present invention.

FIG. 3 is a flow chart describing the logic sequence of the current invention shown in FIG. 2. In block 23a, the current state of the matrix 15 output at node 16 is examined; if the current state is high, the circuitry assumes that the next state will be low (block 23b) and increases current through the current sources 20 in block 23c. The pull-up output of the switching circuitry 22 is decreased in block 23d. If the current state corresponds to a low logic level in block 23a, the circuitry assumes that the next state will be a high logic level (block 23e) and decreases the current through current sources 20 in block 23f. Simultaneously, the pull-up output of the switching circuitry 22 is increased (block 23g) providing a faster pull-up for the matrix output during a low-to-high transition.

Figure 4:
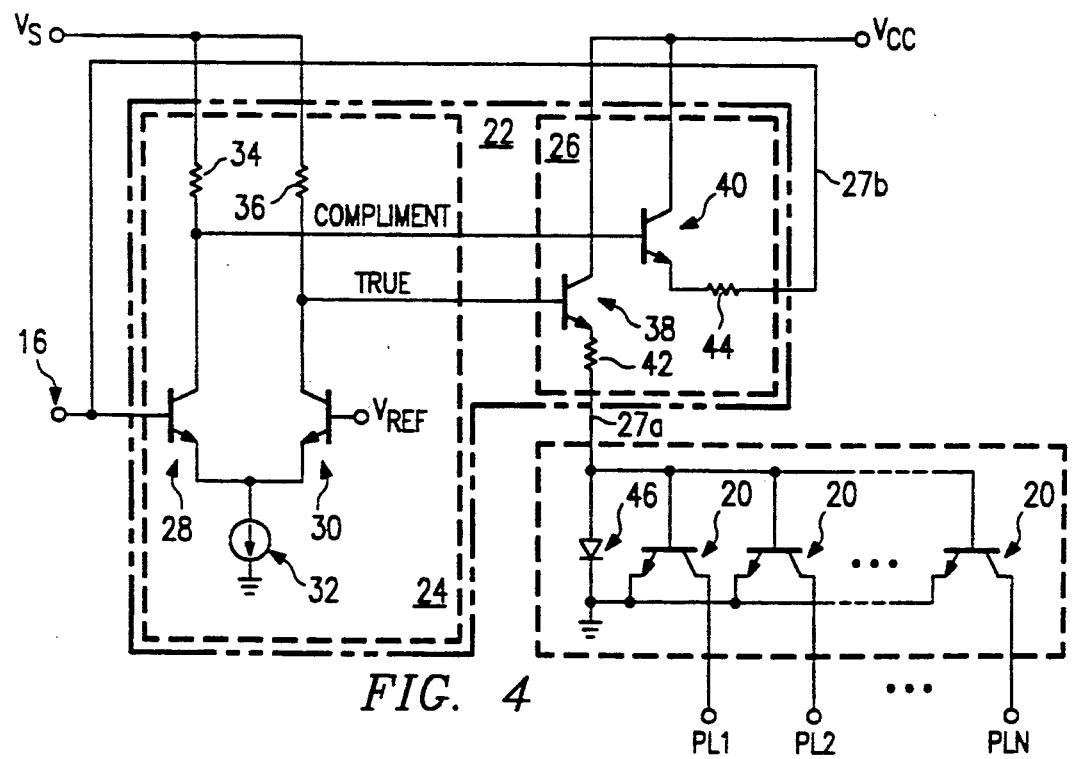
FIG. 4 illustrates a schematic representation of the preferred embodiment of the present invention.

FIG. 4 illustrates the schematic representation of a preferred embodiment of the switching circuitry 22 of the present invention. The input to sensing circuitry 24 is coupled to the output of the memory matrix at node 16. The true and complement outputs of sensing circuitry 24 are coupled to current switching circuitry 26 having an output 27a coupled to current sources 20 and an output 27b coupled to node 16.

Sensing circuitry 24 comprises a differential pair formed of transistors 28 and 30, a current source 32 and biasing resistors 34 and 36. The base of input transistor 28 is coupled to node 16, its emitter is coupled to current source 32 and the emitter of input transistor 30, and its collector is coupled one end of resistor 34. The base of input transistor 30 is coupled to a reference voltage ($V_{REF}$) and the collector is coupled one end of resistor 36. The second ends of resistors 34 and 36, are each coupled to a voltage source $V_S$. The collectors of input transistors 28 and 30 comprise the complement and true outputs, respectively, of the sensing circuitry 28.

Switching circuitry 26 comprises transistors 38 and 40 coupled to sensing circuitry 24, resistor 42 coupled to current sources 20, and resistor 44 coupled to node 16. The base of switching transistor 38 is coupled to the collector of input transistor 30 (the true output), the collector is coupled to $V_{cc}$ and the emitter is coupled to one end of resistor 42. The base of switching transistor 40 is coupled to the collector of input transistor 28 (the complement output), the collector is coupled to $V_{cc}$, and the emitter is coupled to one end of resistor 44. The second end of resistor 42 is coupled to current sources 20 and the second end of resistor 44 is coupled to node 16.

Current source transistors 20 have bases coupled to the output 27a of switching circuitry 26, emitters coupled to ground, and collectors coupled to product lines PL1-PLN. The anode of diode 46 is coupled to the second end of resistor 42 of switching circuitry 26 and the cathode of diode 46 is coupled to ground.

In operation, differential input pair 28 and 30 sense the current state of the matrix output at node 16. When that state is high, input transistor 28 turns on and input transistor 30 switches low; in turn, switching transistor 40 turns off and switching transistor 38 switches high. Switching transistor 38; therefore, allows more current to flow through resistor 42, increasing current sources 20. Diode 46 provides a voltage reference for current sources 20. With current sources 20 on high, the circuit is prepared to pull down product lines PL1-PLN when the signal at node 16 makes a transition to a low logic level When the matrix output at node 16 is at a low logic level, input transistor 28 turns off and input transistor 30 turns on; switching transistor 38 switches low and switching transistor 40 switches high. With switching transistor 38 low, less current flows through resistor 42 and current sources 20 turn lower, thus reducing unnecessary power consumption. Because the current sources 20 are driving low current while the output 16 is low, a subsequent low-to-high transition is not impeded by the current sources. Furthermore, with switching transistor 40 high, more current flows through resistor 44 enabling the matrix output at node 16 to be rapidly pulled to a high logic level at the appropriate time.

Consequently, the present invention provides the technical advantage of more rapid transitions in both the high-to-low and low-to-high directions while reducing unnecessary power consumption.

It should be noted that although the present invention has been described in connection with bipolar technology, other technologies, such as CMOS, could be used as well.

Although the present invention has been described in detail, it should be understood that various changes, substitutions and alterations can be made herein without departing from the spirit and scope of the invention, as defined by the appended claims.

What is claimed is:

1. Circuitry for providing rapid switching of a logic array comprising a plurality of product lines and an output operable to generate high and low array output logic states, comprising:

current generating circuitry coupled to said product lines and operable to generate a first and a second nonzero magnitude of current through said product lines, said current generating circuitry comprising:

a diode having an anode coupled to control circuitry and a cathode coupled to ground, said diode operable to establish a voltage level;

a plurality of transistors operable to generate current responsive to said voltage level; and said control circuitry operable to select which of said first and second nonzero magnitude of current is generated responsive to said array output logic state.

2. The circuitry of claim 1 wherein said control circuitry comprises circuitry coupled to said current generating circuitry operable to increase current generated by said current generating circuitry to said first magnitude responsive to a first array output logic state and to decrease current generated by said current generating circuitry to said second magnitude responsive to a second array output logic state.

3. The circuitry of claim 1 wherein said control circuitry comprises:

sensing circuitry coupled to said array output and operable to detect the state of said array output; and switching control circuitry coupled to said sensing circuitry and operable to control the current generated by said current generating circuitry.

4. The circuitry of claim 3 wherein said sensing circuitry comprises a differential transistor pair coupled between said array output and said switching control circuitry.

5. The circuitry of claim 4 wherein said differential transistor pair comprises:

a first NPN sensing transistor having an emitter coupled to a current source, a base coupled to said array output and a collector coupled to said switching control circuitry; and a second NPN sensing transistor having an emitter coupled to said current generating circuitry, a base coupled to a reference voltage, and a collector coupled to said switching control circuitry.

6. The circuitry of claim 5 wherein said sensing circuitry further comprises a first resistor coupled between said collector of said first NPN sensing transistor and a voltage source $V_s$, and a second resistor coupled between said collector of said second NPN sensing transistor and $V_s$.

7. The circuitry of claim 3 wherein said sensing circuitry comprises:
   a first NPN sensing transistor having an emitter coupled to said current generating circuitry, a base coupled to said collector of said second NPN sensing transistor, and a collector coupled to $V_{cc}$; and
   a second NPN sensing transistor having an emitter coupled to said array output, a base coupled to said collector of said first NPN sensing transistor, and a collector coupled to $V_{cc}$.

8. The circuitry of claim 7 wherein said switching control circuitry further comprises:
   a first resistor coupled between said emitter of said first NPN sensing transistor and said anode of said diode of said current generating circuitry; and
   a second resistor coupled between said emitter of said second NPN sensing transistor and said array output.

9. A method for providing rapid switching of a logic array comprising a plurality of product lines and an output operable to generate high and low logic states, comprising the steps of:
   sensing the logic state of said array output; and
   controlling a current through said product lines by selecting one of a first and a second nonzero magnitude of said current to be generated through said product lines responsive to said sensed state, whereby said logic state is sensed by a diode operatively coupled to said array output, and said one of a first and a second nonzero magnitude of said current is selected by a plurality of transistors operable to generate current responsive to said sensed logic state.

10. The method of claim 9 wherein said controlling step comprises the step of controlling a current source with a switching transistor.

11. The method of claim 9 wherein said controlling step comprises the steps of:
   increasing said current through said product lines to said first magnitude when said array output is in a first logic state; and
   decreasing said current through said product lines to said second magnitude when said array output is in a second logic state.

12. The method of claim 11 and further comprising the step of increasing the voltage of said product lines responsive to said second logic state.

13. The method of claim 12 wherein said increasing the voltage step comprises the step of switching high a switching transistor coupled to said product liens and to a voltage source.

14. The method of claim 11 wherein said first logic state comprises a high logic state and wherein said second logic state comprises a low logic state.

15. The method of claim 9 wherein said sensing step comprises the step of comparing said array output state to a fixed reference voltage.

16. The method of claim 15 wherein said comparing step comprises the steps of:
   driving a first sensing transistor of a differential pair with said array output;
   driving a second sensing transistor of said differential pair with a reference voltage such that said first sensing transistor is turned off and said second sensing transistor is turned on when said array output is in a high logic state and said first sensing transistor is turned on and said second sensing transistor is turned off when said array output is in a low logic state.

* * * * *